United States Patent
Ogawa et al.

(10) Patent No.: US 10,424,648 B2
(45) Date of Patent: Sep. 24, 2019

(54) COPPER AND/OR COPPER OXIDE DISPERSION, AND ELECTROCONDUCTIVE FILM FORMED USING DISPERSION

(71) Applicant: ASAHI KASEI KABUSHIKI KAISHA, Tokyo (JP)

(72) Inventors: Shimpei Ogawa, Tokyo (JP); Eiichi Ohno, Tokyo (JP); Masanori Tsuruta, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 4 days.

(21) Appl. No.: 14/906,422

(22) PCT Filed: Jul. 22, 2014

(86) PCT No.: PCT/JP2014/069321
§ 371 (c)(1),
(2) Date: Jan. 20, 2016

(87) PCT Pub. No.: WO2015/012264
PCT Pub. Date: Jan. 29, 2015

(65) Prior Publication Data
US 2016/0155814 A1    Jun. 2, 2016

(30) Foreign Application Priority Data
Jul. 23, 2013    (JP) .................. 2013-152799

(51) Int. Cl.
*H01L 29/76*    (2006.01)
*H01L 29/423*    (2006.01)
(Continued)

(52) U.S. Cl.
CPC ........ *H01L 29/42372* (2013.01); *C09C 1/627* (2013.01); *C09D 11/037* (2013.01);
(Continued)

(58) Field of Classification Search
CPC ................................... H01B 1/20; H01B 1/22
(Continued)

(56) References Cited

U.S. PATENT DOCUMENTS 2,091,800 A * 8/1937 Adkins ................. C07C 29/149
502/306
3,213,145 A * 10/1965 Field ...................... B01J 23/868
502/318
(Continued)

FOREIGN PATENT DOCUMENTS

JP    2005-15628 A    1/2005
JP    2010-129790 A   6/2010
(Continued)

OTHER PUBLICATIONS

Kim et al., "Surface Free Energy Analysis of Poly(vinyl alcohol) Films Having Various Molecular Parameters", Journal of Applied Polymer Science (2007) pp. 424-428.*
(Continued)

*Primary Examiner* — Jay C Kim
(74) *Attorney, Agent, or Firm* — Greenblum & Bernstein, P.L.C

(57) ABSTRACT

To provide a copper and/or copper oxide dispersion capable of forming an electroconductive film exhibiting excellent stability with respect to temporal change and having a fine pattern form, an electroconductive film laminate obtained by laminating the electroconductive film produced using the copper and/or copper oxide dispersion, and an electroconductive film transistor. The copper and/or copper oxide dispersion contains 0.50-60 mass % of copper and/or copper oxide microparticies and the following components (1)-(4): (1) a surface energy modifier; (2) an organic compound having a phosphate group; (3) 0.050-10 mass % of a solvent having a vapor pressure of 0.010 Pa to less than 20 Pa at 20° C.; and (4) a solvent having a vapor pressure of 20 Pa to 150 hPa at 20° C. The electroconductive laminate is obtained by laminating an electroconductive film containing copper on a substrate.

8 Claims, 2 Drawing Sheets

(51) Int. Cl.
*C09D 11/52* (2014.01)
*H05K 1/09* (2006.01)
*C09C 1/62* (2006.01)
*H01B 1/22* (2006.01)
*H01L 29/45* (2006.01)
*H01L 29/49* (2006.01)
*H01L 29/786* (2006.01)
*C09D 11/037* (2014.01)
*H01B 1/20* (2006.01)
*H01L 29/417* (2006.01)

(52) U.S. Cl.
CPC ............... *C09D 11/52* (2013.01); *H01B 1/20* (2013.01); *H01B 1/22* (2013.01); *H01L 29/41725* (2013.01); *H01L 29/45* (2013.01); *H01L 29/4908* (2013.01); *H01L 29/7869* (2013.01); *H05K 1/092* (2013.01); *C01P 2004/03* (2013.01); *C01P 2006/40* (2013.01)

(58) Field of Classification Search
USPC ........................................................ 257/288
See application file for complete search history.

(56) References Cited

U.S. PATENT DOCUMENTS

| | | | | |
|---|---|---|---|---|
| 4,990,690 A * | 2/1991 | Onda | ..................... | C07C 29/149 568/811 |
| 5,855,818 A * | 1/1999 | Gan | ......................... | A43B 7/36 252/503 |
| 5,855,820 A * | 1/1999 | Chan | ......................... | C09D 5/24 252/511 |
| 6,086,790 A * | 7/2000 | Hayashi | .................... | H01B 1/22 106/1.05 |
| 6,451,433 B1 * | 9/2002 | Oka | ......................... | H01B 1/02 106/1.23 |
| 7,238,654 B2 * | 7/2007 | Hodge | ................... | A01N 59/16 106/15.05 |
| 7,425,474 B2 * | 9/2008 | Kawase | .............. | H01L 51/0021 438/142 |
| 7,663,004 B2 * | 2/2010 | Suppes | ................. | C07C 29/145 568/861 |
| 7,858,818 B2 * | 12/2010 | Cromer | ................... | C07F 7/025 556/400 |
| 7,915,459 B2 * | 3/2011 | Periana | ................ | B01J 31/1805 568/910 |
| 7,976,733 B2 * | 7/2011 | Chopra | ................ | C09D 11/037 106/31.13 |
| 8,084,401 B2 * | 12/2011 | Lukocs | ................... | C07F 9/091 166/305.1 |
| 8,252,961 B2 * | 8/2012 | Suppes | ................... | C07C 29/145 568/861 |
| 8,506,849 B2 * | 8/2013 | Li | ....................... | C09D 11/101 106/31.13 |
| 8,933,279 B2 * | 1/2015 | Morvan | ................ | C07C 29/172 568/902.2 |
| 8,980,135 B2 * | 3/2015 | Takeda | ................... | B82Y 30/00 252/500 |
| 9,018,427 B2 * | 4/2015 | Gadewar | ................. | B01J 23/00 568/881 |
| 9,181,493 B2 * | 11/2015 | Narula | ..................... | C10G 3/00 |
| 9,267,156 B2 * | 2/2016 | Amano | ..................... | C07C 1/24 |
| 9,412,487 B2 * | 8/2016 | Iijima | ..................... | H01B 1/22 |
| 9,452,933 B2 * | 9/2016 | Suib | ........................ | C01G 1/02 |
| 9,496,069 B2 * | 11/2016 | Kozu | ........................ | B22F 9/24 |
| 9,664,009 B2 * | 5/2017 | Lembcke | ................. | E21B 37/04 |
| 9,670,119 B2 * | 6/2017 | Weiner | .................. | C07C 29/141 |
| 9,953,740 B2 * | 4/2018 | Omori | ................... | B22F 1/0062 |
| 9,972,413 B2 * | 5/2018 | Omori | ..................... | H01B 1/22 |
| 2006/0189113 A1 * | 8/2006 | Vanheusden | .......... | B22F 1/0018 438/597 |
| 2008/0206553 A1 * | 8/2008 | Schneider | ................ | C09D 5/24 428/328 |
| 2009/0214764 A1 * | 8/2009 | Li | .......................... | B22F 1/0018 427/98.4 |
| 2010/0009540 A1 * | 1/2010 | Kamiya | ............... | C09K 3/1463 438/693 |
| 2010/0148131 A1 | 6/2010 | Kotake et al. | | |
| 2012/0207918 A1 | 8/2012 | Seong et al. | | |
| 2014/0008586 A1 | 1/2014 | Paik et al. | | |
| 2014/0090699 A1 * | 4/2014 | Arai | ........................ | H01B 1/20 136/255 |
| 2014/0127409 A1 * | 5/2014 | Harada | ..................... | H01B 1/22 427/331 |
| 2014/0216798 A1 | 8/2014 | Kawato et al. | | |
| 2014/0342177 A1 * | 11/2014 | Wiley | ................... | B82Y 30/00 428/605 |
| 2015/0282310 A1 * | 10/2015 | Kawakita | ................ | H01B 1/22 428/139 |
| 2016/0007455 A1 * | 1/2016 | Kawato | .................. | H05K 1/092 428/457 |

FOREIGN PATENT DOCUMENTS

| | | | | |
|---|---|---|---|---|
| JP | 2012-216425 A | | 11/2012 | |
| JP | 2013-503234 A | | 1/2013 | |
| JP | 2013-109966 A | | 6/2013 | |
| WO | WO 03/051562 | * | 6/2003 | ............... B22F 9/00 |
| WO | 2008/111484 A1 | | 9/2008 | |
| WO | WO 2012/084813 | * | 6/2012 | ............ C09D 11/00 |
| WO | 2012/115475 A2 | | 8/2012 | |
| WO | 2012/115475 A3 | | 8/2012 | |
| WO | 2013/073200 A1 | | 5/2013 | |
| WO | WO 2013/077448 | * | 5/2013 | ............... H05K 3/12 |

OTHER PUBLICATIONS

Nishino et al., Poly(vinyl alcohol) with low surface free energy by fluorination, International Journal of Adhesion & Adhesives 19 (1999) pp. 399-403.*

Vazquez et al., "Surface Tension of Alcohol + Water from 20 to 50 oC", Journal of Chemical Engineering Data (1995) pp. 611-614.*

"Two-Component Surface Energy Characterization as a Predictor of Wettability and Dispersability" (2000).*

International Search Report issued with respect to application No. PCT/JP2014/069321, dated Oct. 28, 2014.

International Preliminary Report on Patentability issued with respect to application No. PCT/JP2014/069321, dated Jan. 26, 2016.

Supplementary European Search Report in the prosecution of EP Patent Application No. 14829560.3, dated Jun. 28, 2016.

* cited by examiner

COPPER AND/OR COPPER OXIDE DISPERSION, AND ELECTROCONDUCTIVE FILM FORMED USING DISPERSION

TECHNICAL FIELD

The present invention relates to a copper and/or copper oxide dispersion that is stable over time, to an electroconductive film laminate obtained by laminating electroconductive films formed using the dispersion, and to a transistor including the electroconductive film as an electrode. The dispersion of the invention may be used as a coating material or, since copper and/or copper oxide microparticles are easily reduced to produce metallic copper, it may be utilized as a conductive material precursor.

BACKGROUND ART

Conventional circuit boards having conductive wiring on a substrate have been produced by coating a photoresist on a substrate with a metal foil attached, exposing a desired circuit pattern to the photoresist, and forming a pattern by chemical etching. By this conventional method for producing circuit boards, it is possible to produce high-performance conductive substrates. However, the conventional circuit board production method is disadvantageous in that it has many steps and is complex, while also requiring a photoresist material.

On the other hand, there is increasing interest, in methods of printing of patterns directly on substrates with coating materials comprising dispersed metals or metal oxides. Such methods of printing patterns directly onto substrates do not require use of a photoresist material, and are highly productive methods.

In PTL 1 referenced below, there is proposed a cuprous oxide dispersion containing cuprous oxide microparticles with a mean secondary particle size of 80 nm or smaller, and a polyhydric alcohol having 10 or less carbon atoms. According to PTL 1, the cuprous oxide dispersion has high stability and allows formation of a copper thin-film coating onto a substrate and sintering. Specifically, the cuprous oxide dispersion, having cuprous oxide microparticles dispersed in a diethylene glycol dispersing medium together with polyethylene glycol, undergoes no loss of dispersibility even when allowed to stand overnight. The dispersion is coated onto a glass plate to form a copper thin-film with a thickness of 2.5 μm and a volume resistivity of $8 \times 10^{-5}$ Ωcm (see PTL 1, Examples 3 and 6).

In PTL 2 referenced below, there is proposed a metal oxide dispersion including metal oxide microparticles with a mean primary particle size of 20 to 100 nm, a dispersing medium and a dispersing agent. According to PTL 2, the dispersion has high dispersibility at high concentration and low viscosity, and is therefore suitable for ink-jet uses as well.

However, a technique for efficient production of even higher performance conductive substrates has not yet been established. Consequently, no technique has yet been established for efficient production of transistors by direct printing of patterns of electrodes, semiconductors and insulating films onto substrates. In order to form transistor electrode patterns, it is desirable to develop a printing technique that allows formation of more intricately patterned electroconductive films, and a copper and/or copper oxide dispersion that is applicable in the printing technique. In particular, reverse printing methods are suitable for formation of intricate patterns, but no copper and/or copper oxide dispersion has yet been developed that has the dispersibility and coatability necessary for a reverse printing method.

CITATION LIST

Patent Literature

[PTL 1] Japanese Unexamined Patent. Publication No. 2005-15628
[PTL 2] Japanese Unexamined Patent. Publication No. 2012-216425

DISCLOSURE OF THE INVENTION

Problems to be Solved by the Invention

The problem to be solved by the present invention is to provide a copper and/or copper oxide dispersion that exhibits excellent stability against change over time and that can form intricately patterned electroconductive films, as well as an electroconductive film laminate obtained by laminating an electroconductive film produced using the copper and/or copper oxide dispersion, and an electroconductive film transistor including the electroconductive film as an electrode.

Means for Solving the Problems

As a result, of diligent research directed toward achieving the aforementioned object, the present inventors have found that it can be achieved by preparing a copper and/or copper oxide dispersion where the dispersing medium has a prescribed composition and component concentration, and printing the copper and/or copper oxide dispersion, and have completed this invention based upon this finding.

Specifically, the present invention provides the following.
[1] An electroconductive film laminate comprising a copper-containing electroconductive film laminated on a substrate, wherein the area of the electroconductive film laminate has a diameter of 7 inches or greater, calculated as a circle.
[2] An electroconductive film laminate according to [1] above, wherein the electroconductive film is formed by printing a copper and/or copper oxide dispersion.
[3] An electroconductive film laminate according to [1] or [2] above, wherein the printing is reverse printing.
[4] An electroconductive film laminate according to any one of [1] to [3] above, wherein the minimum line width of the electroconductive film is between 0.10 μm and 30 μm, inclusive, and the minimum space width is between 0.10 μm and 30 μm, inclusive.
[5] A dispersion of copper and/or copper oxide, for use in forming an electroconductive film for an electroconductive film laminate according to any one of [1] to [4] above, wherein the dispersion contains copper and/or copper oxide microparticles at between 0.50 mass % and 60 mass %, inclusive, as well as the following (1) to (4):
 (1) a surface energy modifier,
 (2) an organic compound having a phosphate group,
 (3) a solvent having a vapor pressure of 0.010 Pa or higher and lower than 20 Pa at 20° C., in an amount of between 0.050 mass % and 10 mass %, inclusive, and
 (4) a solvent having a vapor pressure of between 20 Pa and 150 hPa, inclusive, at 20° C.
[6] A dispersion according to [5] above, wherein the (1) surface energy modifier is a fluorine-containing surfactant.

[7] A dispersion according to [6] above, wherein the content of the fluorine-containing surfactant is between 0.10 mass % and 2.0 mass %, inclusive.

[8] A dispersion according to any one of [5] to [7] above, wherein the content of the (2) organic compound having a phosphate group is between 0.10 mass % and 20 mass %, inclusive.

[9] A dispersion according to any one of [5] to [8] above, wherein the (3) solvent having a vapor pressure of 0.010 Pa or higher and lower than 20 Pa at 20° C. is a polyhydric alcohol having 10 or less carbon atoms.

[10] A dispersion according to any one of [5] to [9] above, wherein the (4) solvent having a vapor pressure of between 20 Pa and 150 hPa, inclusive, at 20° C. is a monoalcohol having 10 or less carbon atoms.

[11] A dispersion according to any one of [5] to [10], wherein the copper and/or copper oxide is cuprous oxide or cupric oxide.

[12] A dispersion according to [11] above, wherein the copper and/or copper oxide is cuprous oxide.

[13] A transistor including a gate electrode, a source electrode, a drain electrode, an insulating layer and a semiconductor layer, wherein at least one electrode from among the gate electrode, source electrode and drain electrode is an electroconductive film according to any one of [1] to [4] above, or an electroconductive film formed by reverse printing of a dispersion according to any one of [5] to [12] above.

[14] A dispersion of copper and/or copper oxide, containing copper and/or copper oxide microparticles at between 0.50 mass % and 60.0 mass %, inclusive, and the following (1) to (4):

(1) a fluorine-containing surfactant at between 0.10 mass % and 2.0 mass %, inclusive, (2) an organic compound having a phosphate group, at between 0.10 mass % and 20 mass %, inclusive, (3) a polyhydric alcohol having 10 or less carbon atoms at between 0.050 mass % and 10 mass %, inclusive, and (4) a monoalcohol having 10 or less carbon atoms.

Effect of the Invention

The copper and/or copper oxide dispersion of the invention has excellent dispersion stability and coatability, and is therefore suitable for use in reverse printing, and can form an intricately patterned coated film on a substrate. Thus, the copper and/or copper oxide dispersion of the invention may be suitably applied for uses such as coating materials, metal wiring materials, as well as conductive materials. In addition, since the electroconductive film transistor of the invention has an intricately patterned electrode (high-definition copper electrode), formed by a step of printing the copper and/or copper oxide dispersion, it can be suitably applied for use in high-performance electronic devices.

BEST MODE FOR CARRYING OUT THE INVENTION

Figure 1:
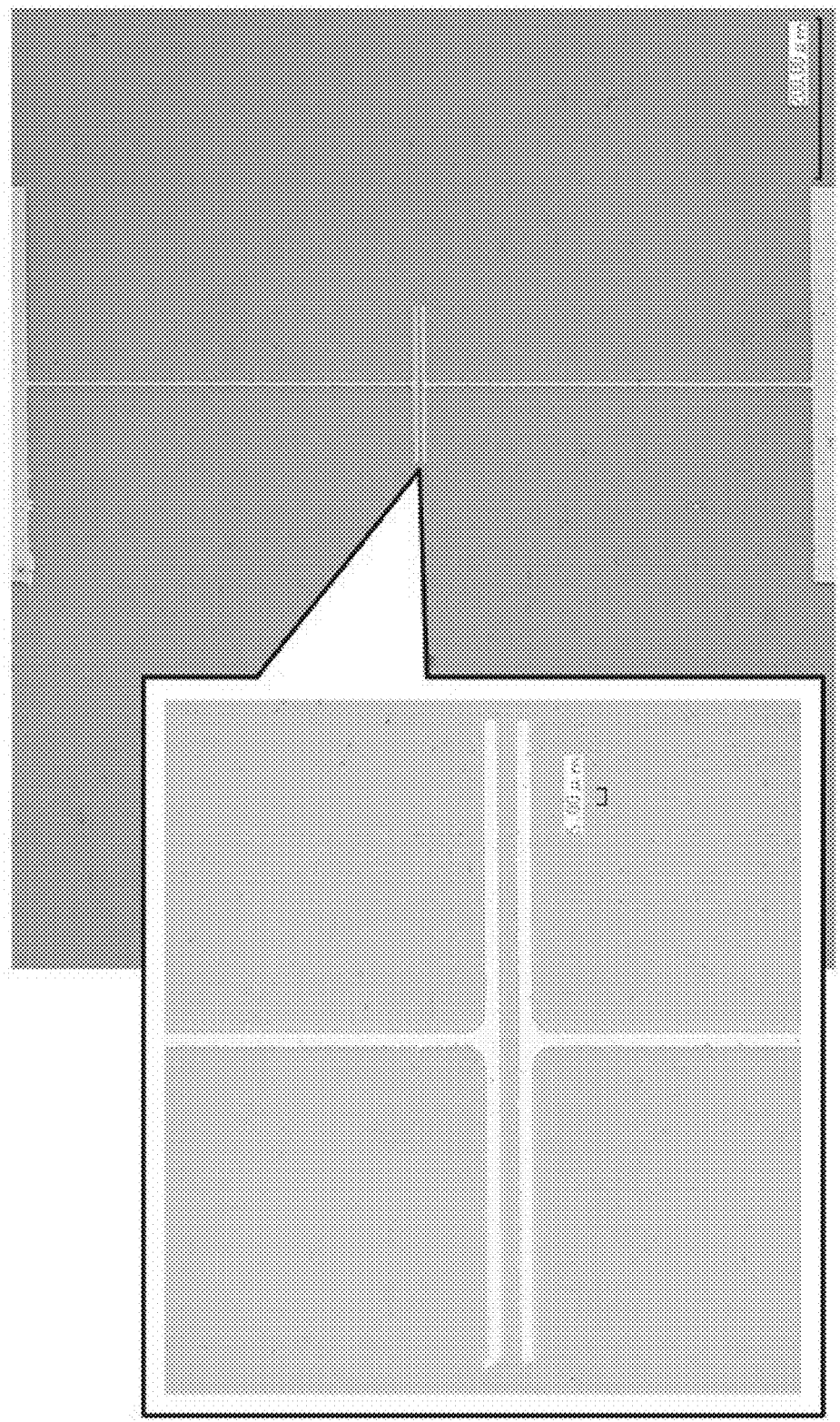
FIG. 1 is a schematic diagram of a source electrode and a drain electrode.

First, the copper and/or copper oxide dispersion of the invention will be explained in detail.

[Copper and/or Copper Oxide Dispersion]

The dispersion of this embodiment contains, in a dispersing medium, copper and/or copper oxide microparticles at between 0.50 mass % and 60 mass %, inclusive, as well as at least the following (1) to (4):

(1) a surface energy modifier, (2) an organic compound having a phosphate group, (3) a solvent having a vapor pressure of 0.010 Pa or higher and lower than 20 Pa at 20° C., in an amount of between 0.050 mass % and 10 mass %, inclusive, and (4) a solvent having a vapor pressure of between 20 Pa and 150 hPa, inclusive, at 20° C., Or, in other words, the dispersion of this embodiment contains at least copper and/or copper oxide microparticles, a surface energy modifier, an organic compound having a phosphate group, and a dispersing medium.

There are no particular restrictions on the viscosity of the dispersion of this embodiment at 25° C., but it is preferably no greater than 100 mPa·s and even more preferably no greater than 30 mPa·s, in the region where the shear rate is $1 \times 10^{-1}$ s$^{-1}$ to $1 \times 10^{2}$ s$^{-1}$, as measured using a cone-plate rotating viscosimeter. The viscosity at 25° C. is preferably no greater than 100 mPa·s, for easy formation of a homogeneous coated film during printing.

There are no particular restrictions on the surface free energy of the dispersion of this embodiment at 25° C., but it is preferably no greater than 40 mN/m, more preferably no greater than 35 mN/m and even more preferably no greater than 30 mN/m. In reverse printing as described below, the surface free energy at 25° C. is preferably no greater than 40 mN/m, from the viewpoint of wettability of the dispersion on a blanket. The surface free energy can be measured using a contact angle meter.

[(1) Surface Energy Modifier]

The copper and/or copper oxide dispersion of this embodiment contains a surface energy modifier in order to improve the coatability. This improves the smoothness of the dispersion coating film that is coated, when the dispersion coating film is formed on a blanket, yielding a more homogeneous coating film.

Specific examples of surface energy modifiers include Triton X-45, Triton X-100, Triton X, Triton A-20, Triton X-15, Triton X-114, Triton X-405, Tween #20, Tween #40, Tween #60, Tween #80, Tween #85, Pluronic F-68, Pluronic F-127, Span 20, Span 40, Span 60, Span 80, Span 83, Span 85, "SURFLON S-211", "SURFLON S-221", "SURFLON S-231", "SURFLON S-232", "SURFLON S-233", "SURFLON S-242", "SURFLON S-243" and "SURFLON S-611" by AGC Seimi Chemical Co., Ltd., "NovecFC-4430" and "NovecFC-4432" by 3M Co., and "MEGAFACE F-444" and "MEGAFACE F-558" by DIC Corp. Particularly preferred among these are fluorine-containing surfactants, with "SURFLON S-211", "SURFLON S-221", "SURFLON S-231", "SURFLON S-232", "SURFLON S-233", "SURFLON S-242", "SURFLON S-243" and "SURFLON S-611" by AGC Seimi Chemical Co., Ltd., "NovecFC-4430" and "NovecFC-4432" by 3M Co. and "MEGAFACE F-444" and "MEGAFACE F-558" by DIC Corp. being preferred. These may be used alone, or more than one may be used in admixture.

The addition amount of surface energy modifier is not particularly restricted, but it is preferably between 0.010 mass % and 2.0 mass %, inclusive, and more preferably 0.10 to 1.5 mass %, of the total dispersion. An amount of 0.010 mass % or greater will tend to result in a homogeneous dispersion coating film, with fewer irregularities. Also, for a dispersion coating film that is homogeneous without irregularities, without residue from the surface energy modifier in the electroconductive film obtained by sintering, and for satisfactory electroconductivity, the amount of addition is preferably no greater than 2.0 mass %.

[(2) Organic Compound having Phosphate Group (Dispersing Agent)]

The dispersing agent included in the dispersion of this embodiment is an organic compound having a phosphate group. The phosphate group is adsorbed onto the copper and/or copper oxide microparticles, inhibiting aggregation by a steric hindrance effect.

The number-average molecular weight of the dispersing agent is not particularly restricted, but is preferably 300 to 30,000. A value of 300 or greater will tend to increase the dispersion stability of the obtained dispersion, while a value of 30,000 or less will facilitate sintering.

Specific examples of dispersing agents include "Disperbyk-142", "Disperbyk-145", "Disperbyk-110", "Disperbyk-111", "Disperbyk-180" and "Byk-9076" by Byk-Chemie Corp., and "PLYSURF M208F" and "PLYSURF DBS" by Dai-ichi Kogyo Seiyaku Co., Ltd. These may be used alone, or more than one may be used in admixture.

The content of the organic compound having a phosphate group in the dispersion of this embodiment, with respect to the total dispersion, is between 0.10 mass % and 20 mass %, inclusive, preferably between 0.20 mass % and 15 mass %, inclusive and more preferably between 1.0 mass % and 8.0 mass %, inclusive. When the content is greater than 20 mass %, residue from the dispersing agent in the electroconductive film obtained by sintering will increase, tending to result in poor electroconductivity. Also, the content is preferably 0.10 mass % or greater in order to obtain sufficient dispersibility without aggregation of the copper and/or copper oxide microparticles.

[(3) Solvent having Vapor Pressure of 0.010 Pa or Higher and Lower than 20 Pa at 20° C., and (4) Solvent having Vapor Pressure of between 20 Pa and 150 hPa, inclusive, at 20° C. (Dispersing Medium)]

The dispersing medium to be used in the dispersion of this embodiment includes a mixture of (3) a solvent having a vapor pressure of 0.010 Pa or higher and lower than 20 Pa at 20° C., and (4) a solvent having a vapor pressure of between 20 Pa and 150 hPa, inclusive, at 20° C. When the coated film is to be formed by reverse printing as described below, a portion of solvent (3) remains on the blanket, and it is important for the dispersion coating film to be in a semi-dry state. Using solvent (4) in combination with the aforementioned surface energy modifier and the dispersing agent described below, contributes to improved dispersion stability of the dispersion in air, and improved coatability on the blanket.

For solvent (3), the vapor pressure at 20° C. is 0.010 Pa or higher and lower than 20 Pa, preferably 0.05 Pa or higher and lower than 16 Pa, and more preferably 0.1 Pa or higher and lower than 14 Pa. In order to maintain the dispersion coating film in a semi-dry state, the vapor pressure is preferably lower than 20 Pa. The vapor pressure is preferably 0.010 Pa or higher in order to prevent the electroconductivity from being impaired by the residue that could not be completely removed in the sintering treatment described below.

The vapor pressure at 20° C. for solvent (4) is between 20 Pa and 150 hPa, inclusive, preferably between 100 Pa and 100 hPa, inclusive, and more preferably between 300 Pa and 20 hPa, inclusive. The vapor pressure is preferably no higher than 150 hPa, in order to help stabilize the content of the copper and/or copper oxide microparticles in the dispersion, even with a high rate of volatilization of the solvent. When the vapor pressure is 20 Pa or higher, the dispersion coating film reaches a semi-dry state in an appropriate time.

The content of the solvent (3) in the dispersion of this embodiment, with respect to the total dispersion, is between 0.050 mass % and 10 mass %, inclusive, preferably between 0.10 mass % and 9.0 mass %, inclusive and more preferably between 0.20 mass % and 8.0 mass %, inclusive. A content of 0.050 mass % or greater is preferred, since this will result in a suitable drying speed in air, and will tend to prevent printing defects. It is preferably no greater than 10 mass %, in order to prevent the electroconductivity from being impaired by the residue that could not be completely removed in the sintering treatment described below.

Specific examples for solvent (3) include propyleneglycol monomethyl ether acetate, 3-methoxy-3-methyl-butyl acetate, ethoxyethyl propionate, propyleneglycol monomethyl ether, propyleneglycol monoethyl ether, propyleneglycol monopropyl ether, propyleneglycol tertiary butyl ether, dipropyleneglycol monomethyl ether, ethyleneglycol butyl ether, ethyleneglycol ethyl ether, ethyleneglycol methyl ether, xylene, mesitylene, ethylbenzene, octane, nonane, decane, ethylene glycol, 1,2-propylene glycol, 1,3-butylene glycol, 2-pentanediol, 4,2-methylpentane-2,4-diol, 2,5-hexanediol, 2,4-heptanediol, 2-ethylhexane-1,3-diol, diethylene glycol, dipropylene glycol, hexanediol, octanediol, triethylene glycol, tri-1,2-propylene glycol and glycerol. More preferred among these are polyhydric alcohols having 10 or less carbon atoms. These polyhydric alcohols may be used alone, or more than one may be used in admixture. If the number of carbon atoms of the polyhydric alcohol is greater than 10, the dispersibility of the copper and/or copper oxide microparticles may be reduced.

Specific examples for solvent (4) include ethyl acetate, normal-propyl acetate, isopropyl acetate, pentane, hexane, cyclohexane, methylcyclohexane, toluene, methyl ethyl ketone, methyl isobutyl ketone, dimethyl carbonate, methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, phenol, cyclohexanol, methylcyclohexanol, 3,3, 5-trimethylcyclohexanol, benzyl alcohol and diacetone alcohol. Monoalcohols having 10 or less carbon atoms are more preferred among these. Among monoalcohols having 10 or less carbon atoms, ethanol, n-propanol, i-propanol, n-butanol, i-butanol, sec-butanol and t-butanol are more preferred because of their particularly suitable dispersibility, volatility and viscosity. These monoalcohols may be used alone, or more than one may be used in admixture. The carbon number of the monoalcohol is preferably no greater than 10, in order to avoid reduction in the dispersibility of the copper and/or copper oxide microparticles when the number of carbon atoms of the monoalcohol is greater C10.

[Copper and/or Copper Oxide Microparticles]

The dispersion of this embodiment contains copper and/or copper oxide microparticles. Specific examples of copper and/or copper oxide include copper, cuprous oxide, cupric oxide, copper oxides with other oxidation numbers, and particles having a core/shell structure where the core section is copper and the shell section is copper oxide. These may include metal salts and metal complexes as trace impurities. Among these, cuprous oxide and cupric oxide are preferred, since they tend to have excellent dispersibility. Cuprous oxide is particularly preferred, since it tends to facilitate low-temperature sintering. These may be used alone, or more than one may be used in admixture.

There are no particular restrictions on the mean secondary particle size of the copper and/or copper oxide microparticles in the dispersion of this embodiment, and it is preferably no greater than 500 nm, more preferably no greater than 200 nm and even more preferably no greater than 80 nm. The term. "mean secondary particle size" refers to aggregates formed by collection of multiple primary copper and/or copper oxide particles. The mean secondary particle size is preferably 500 nm or smaller, since this will tend to facilitate formation of a fine pattern on the substrate.

The preferred range for the mean primary particle size of primary particles composing the secondary particles is 100 nm or smaller, more preferably 50 nm or smaller and even more preferably 20 nm or smaller. When the mean primary particle size is 100 nm or smaller, it is possible to lower the sintering, temperature, as described below. The reason for low temperature sintering being possible is apparently that a smaller particle size of the metal fine particles increases the surface energy, lowering the melting point.

The content of copper and/or copper oxide particles in the dispersion of this embodiment is between 0.50 mass % and 60 mass %, inclusive, preferably 1.0 to 60 mass %, inclusive, and more preferably 5.0 to 50 mass %, inclusive, of the total dispersion. A content of 60 mass % or lower will tend to help prevent aggregation of the copper and/or copper oxide particles. The content is preferably 0.50 mass % or greater, since the electroconductive film obtained by sintering will not be thin and the electroconductivity will tend to be satisfactory.

The copper and/or copper oxide microparticles that are used may be a commercial product, or they may be synthesized. Commercial products include cupric oxide fine particles with a mean primary particle size of 50 nm by CIK NanoTek Corp. Synthesis methods include the following methods.

(1) A method of thermal reduction in which water and a copper-acetylacetonate complex are added to a polyol solvent, the organic copper compound is once heated to dissolution, and then the water necessary for reaction is added and the temperature is further increased for heating to the reduction temperature of the organic copper.

(2) A method of heating an organic copper compound (copper-N-nitrosophenylhydroxylamine complex) in an inert atmosphere in the presence of a protective agent such as hexadecylamine, at a high temperature of about 300° C.

(3) A method of reducing a copper salt dissolved in an aqueous solution using hydrazine.

Of these, method (3) is preferred as a convenient procedure for producing copper and/or copper oxide with a small particle size.

[Preparation of Copper and/or Copper Oxide Dispersion]

The copper and/or copper oxide dispersion can be prepared by mixing the copper and/or copper oxide microparticles, dispersing medium, dispersing agent and surface energy modifier each in prescribed proportions, by dispersion treatment using, for example, an ultrasonic method, mixer method, triple-roll method, double-roll method, attritor, Banbury mixer, paint shaker, kneader, homogenizer, ball mill, or sand mill.

When preparing the copper and/or copper oxide dispersion, additives may be added to the dispersion, as necessary. As additives, there may be used reducing agents and organic binders, in addition to the surface energy modifier mentioned above.

The viscosity and surface energy of the dispersion can be adjusted by the concentrations of the copper and/or copper oxide, dispersing agent, dispersing medium, surface energy modifier and other additives.

The electroconductive film laminate of the invention will now be described in detail.

[Electroconductive Film Laminate]

The electroconductive film of this embodiment contains copper, formed using the copper and/or copper oxide dispersion of the invention.

The area of the electroconductive film laminate, as seen from the top side in the thickness direction of the laminate of this embodiment, is a diameter of 7 inches or greater, more preferably 10 inches or greater and even more preferably 13 inches or greater, calculated as a circle.

[Printing Method]

The method of printing the dispersion on a substrate and forming a coated film is not particularly restricted, and a method such as screen printing, spray coating, spin coating, slit coating, die coating, bar coating, knife coating, offset printing, reverse printing, flexographic printing, ink let printing, dispenser printing, gravure direct printing or gravure offset printing may be used. Of these printing methods, reverse printing is preferred from the viewpoint of allowing more high definition patterning to be accomplished.

Since a coating solution can be directly printed in a desired pattern on a substrate by the method of this embodiment, it is possible to notably improve productivity compared to methods using a conventional photoresist. Furthermore, using the method of this embodiment, it is possible to fabricate electroconductive film laminates with 7-inch diameter or greater areas, which are difficult to fabricate using conventional photolithography.

[Reverse Printing]

The dispersion of this embodiment can form a patterned coated film on a substrate by reverse printing. In a reverse printing method, first a dispersion coating film having uniform thickness is formed on the surface of a blanket. The surface material of the blanket is usually composed of silicone rubber, and the dispersion must satisfactorily adhere onto the silicone rubber to form a homogeneous dispersion coating film. Therefore, the viscosity and surface free energy of the dispersion are preferably selected to be within the ranges specified above. Next, the surface of the blanket, on whose surface the homogeneous dispersion coating film has been formed, is pressed onto and contacted with a letterpress plate, and the part of the dispersion coating film on the blanket surface is caused to adhere and be transferred onto the surfaces of the projected portions of the letterpress plate. This forms a printing pattern on the dispersion coating film remaining on the surface of the blanket. Next, the blanket in this state is pressed onto the surface of the printing substrate, transferring the dispersion coating film remaining on the blanket and forming a patterned coated film.

[Sintering Treatment]

Sintering in the method for producing an electroconductive film according to this embodiment is not particularly restricted, as long as it is a method allowing metal or metal compound fine particles to be fused to form a metal fine particle sintered film. The sintering in the method for producing an electroconductive film of the invention may be carried out, for example, in a sintering furnace using plasma, a heated catalyst, ultraviolet rays, vacuum ultraviolet rays, an electron beam, infrared lamp annealing, flash lamp annealing, or a laser.

When the obtained sintered film is prone to oxidation, it is preferable to subject the dispersion coated film to heat treatment in a non-oxidizing atmosphere. When the oxide is resistant to reduction with a reducing agent alone in the dispersion, it is preferably sintered in a reducing atmosphere.

A non-oxidizing atmosphere is an atmosphere containing no oxidizing gas such as oxygen, and may be an inert atmosphere or a reducing atmosphere. An inert atmosphere is an atmosphere filled with an inert gas, such as argon, helium, neon or nitrogen, for example. A reducing atmosphere is an atmosphere containing a reducing gas such as hydrogen or carbon monoxide. Such a gas may be filled into a sintering furnace and the dispersion coated film sintered as a sealed system. Alternatively, the sintering furnace may be a circulating system with the gas flowing while sintering the dispersion coated film. When the dispersion coated film is to be sintered in a non-oxidizing atmosphere, preferably the sintering furnace is first brought to a vacuum to remove the oxygen in the sintering furnace, and exchange is carried out with a non-oxidizing gas. The sintering may also be carried out in a pressurized atmosphere, or may be carried out in a reduced pressure atmosphere.

The sintering temperature is not particularly restricted, but is preferably between 20° C. and 400° C., inclusive, more preferably between 50° C. and 300° C., inclusive, and even more preferably between 80° C. and 200° C., inclusive. A temperature of no higher than 400° C. is preferred, since this will allow use of a substrate with low heat resistance. A temperature of 20° C. or higher is preferred, since this is sufficient to promote formation of a sintered film, and tends to result in satisfactory conductivity.

The electroconductive film of this embodiment will now be explained.

[Conductive Pattern]

The electroconductive film of this embodiment can be obtained by using the copper or copper oxide dispersion of the invention described above to form a patterned coated film on the substrate, and subjecting it to sintering treatment. The film thickness of the electroconductive film is not particularly restricted, but is in a range of preferably between 0.010 µm and 100 µm, inclusive, more preferably between 0.050 µm and 50 µm, inclusive, and even more preferably between 0.10 µm and 20 µm, inclusive. When it is smaller than 0.010 µm, the surface resistance will tend to increase.

The minimum line width of the electroconductive film is not particularly restricted, but is in a range of preferably between 0.10 µm and 30 µm, inclusive, more preferably between 0.50 µm and 20 µm, inclusive, and even more preferably between 1.0 µm and 10 µm, inclusive. A value of at least 0.10 µm will tend to prevent wire breakage.

The minimum space width of the electroconductive film is not particularly restricted, but is in a range of preferably between 0.10 µm and 30 µm, more preferably between 0.50 µm and 20 µm and even more preferably between 1.0 µm and 10 µm. A value of at least 0.10 µm will tend to prevent shorting.

The volume resistivity of the electroconductive film of this embodiment is not particularly restricted, but is preferably no greater than $1.0 \times 10^{-4}$ Ω·cm.

A transistor according to this embodiment will now be described.

[Transistor]

The transistor of this embodiment includes a gate electrode, a source electrode, a drain electrode, an insulating layer and a semiconductor layer. At least one of these electrodes is a patterned electroconductive film formed by a reverse printing step of the copper or copper oxide dispersion described above.

[Electrode]

At least one electrode from among the gate electrode, source electrode and drain electrode in the transistor of this embodiment has the conductive pattern of the aforementioned electroconductive film. From the viewpoint of electrode electroconductivity and productivity, it is preferably a copper electrode patterned by reverse printing of the aforementioned copper and/or copper oxide dispersion. FIG. 1 is a schematic diagram showing a source electrode and a drain electrode.

There are no particular restrictions on the other electrodes. The material used may be, for example, a metal material such as gold, silver, copper, aluminum or molybdenum, an oxide material such as indium tin oxide, or an electroconductive polymer such as poly(ethylenedioxythiophene)/polystyrene sultanate (PEDOT/PSS) or polyaniline. The patterning method may be the printing method described above, or a sputtering method, pulse laser accumulation method, vacuum vapor deposition, CVD method, photolithography method, or lift-off method.

[Semiconductor Layer]

The semiconductor material is not particularly restricted, but use of an organic semiconductor material or oxide semiconductor material is preferable, when a flexible substrate is used. An organic semiconductor material is particularly preferred when using a printing method to form a semiconductor layer, but may be an oxide semiconductor material instead, as long as a semiconductor layer can be formed by a printing method.

The organic semiconductor material used may be a polymer organic semiconductor material such as polythiophene, polyallylamine, fluorene-bithiophene copolymer or a derivative thereof, or a low molecular organic semiconductor material such as pentacene, tetracene, copper-phthalocyanine, perylene, or a derivative thereof. There may be used a carbon compound such as carbon nanotubes or fullerene, or a semiconductor nanoparticle dispersion, as a semiconductor layer material. These organic semiconductor materials can be used as an ink solution or dispersion, obtained by dissolution or dispersion in an aromatic solvent, such as toluene. There may be included additives such as dispersing agents or stabilizers that are suitable for the solvents mentioned above.

The method of printing the organic semiconductor is not particularly restricted, and a method such as screen printing, spray coating, spin coating, slit coating, die coating, bar coating, knife coating, offset printing, reverse printing, flexographic printing, ink jet printing, dispenser printing, gravure direct printing or gravure offset printing may be used. Generally, the aforementioned organic semiconductors have low solubility in solvents, and therefore flexographic printing, reverse printing, ink jet printing or dispenser printing is preferred, being suited for printing of low-viscosity solutions. Flexographic printing, in particular, is most preferred, since it has a short printing time and uses small amounts of ink.

Examples of oxide semiconductor materials include oxides containing one or more elements from among zinc, indium, tin, tungsten, magnesium and gallium. Known materials such as zinc oxide, indium oxide, zinc-doped indium oxide, tin oxide, tungsten oxide and indium gallium zinc oxide (In—Ga—Zn—O) may be mentioned, with no limitation to these materials. The structures of such materials may be as single crystals, polycrystalline, microcrystalline, crystal/amorphous mixtures, nanocrystal-dispersed amorphous or amorphous.

The method of forming the oxide semiconductor layer may be formation of a film, using a sputtering method, pulse laser accumulation method, vacuum vapor deposition method, CVD method or sol-gel method, followed by formation or a pattern by a photolithography method, or lift-off method. A more preferred pattern forming method is a method of formation by printing of a dispersion of an oxide semiconductor material dispersed in a solvent. The printing method may involve a similar method as described above, for printing of the organic semiconductor.

[Insulating Layer]

The material of the gate insulating layer is not particularly restricted, but may be a commonly used polymer solution such as polyvinylphenol, polymethyl methacrylate, polyimide, polyvinyl alcohol, parylene, fluorine resin, or epoxy resin, a solution containing dispersed alumina, or silica gel particles, or an inorganic material such as silicon oxide, silicon nitride, silicon oxynitride, aluminum oxide, tantalum oxide, yttrium oxide, hafnium oxide, hafnium aluminate, zirconia oxide, or titanium oxide. A thin-film of PET, PEN, or PES may be used as an insulating film.

The method of forming a gate insulating layer is not particularly restricted, and a dry method such as a vacuum vapor deposition, a vacuum sputtering and a CVD, or a wet method such as spin coating or a slit die method, or another type of method such as lamination, may be applied.

[Substrate]

The substrate is not particularly restricted and may be, for example, a glass such as soda lime glass, non-alkaline glass, borosilicate glass, high strain point glass or quartz glass, or an inorganic material, such as alumina, or silica, or may be a polymer material, or paper. There may be used ordinary soda lime glass with low heat resistance. According to the invention, the transistor of the invention is useful in that a polymer material such as plastic, or paper may be used as the substrate, and particularly in that a resin film may be used.

Resin films to be used as substrates include polyimides, polyamides, polyamideimides, polyethylene terephthalate (PET), polyethylene naphthalate (PEN), polyphenylene sulfide, polyether ether ketones, polyether sulfones, polycarbonates, polyetherimides, epoxy resins, phenol resins, glass-epoxy resins, polyphenylene ethers, acrylic resins, polyolefins such as polyethylene and polypropylene, as well as liquid crystalline polymer compounds. Preferred among these are polyethylene terephthalate (PET) and polyethylene naphthalate (PEN).

There are no particular restrictions on the thickness of the substrate, but in the case of a plastic substrate such as a resin film, it will usually be in the range of between 10 μm and 300 μm, inclusive. When it is 10 μm or greater, deformation of the substrate during formation of the conductive pattern will be inhibited, and this is therefore preferred from the viewpoint of shape stability of the conductive pattern to be formed. It is preferably no greater than 300 μm from the viewpoint of flexibility, when winding up step is carried out continuously. When the substrate is an inorganic material, the thickness will usually be between about 0.10 mm and 10 mm, inclusive, and is preferably between about 0.50 mm and 5.0 mm, inclusive.

The transistor of this embodiment may be suitably provided with a sealing layer, and shielding layer, as necessary. The material of the sealing layer may be selected from among the same materials as for the gate insulating layer. The shielding layer used may be a dispersion of a light-shielding material such as carbon black in any of the materials mentioned as gate materials. The method for their formation may therefore also be any of the same methods as for the gate insulating layer.

EXAMPLES

The invention will now be explained in specific detail by examples, with the understanding that the invention is in no way limited to the examples.

The mean secondary particle sizes of the dispersions were measured by the cumulant method, using an FPAR-1000 by Otsukan electronics Co., Ltd.

The volume resistivity values of the electroconductive films obtained in the examples were measured using a LORESTA GP low resistivity meter by Mitsubishi Chemical Corp.

The mobility values of the transistors obtained in the examples were measured using a Model 4200-SCS Semiconductor Parameter Analyzer by TFF Keithley Instruments Inc.

Example 1

In a mixed solvent of 800 g of water and 400 g of 1,2-propylene glycol (Wako Pure Chemical Industries, Ltd.) there was added 80 g of copper (II) acetate (Wako Pure Chemical Industries, Ltd.), and then 24 g of hydrazine (Wako Pure Chemical Industries, Ltd.) was added, the mixture was stirred and separated into the supernatant and precipitate by centrifugal separation. To 43 g of the obtained precipitate there were added 6.0 g of Disperbyk-145 (BYK-Chemie GmbH) and 24 g of n-butanol (Wako Pure Chemical Industries, Ltd.), and the mixture was dispersed using a homogenizer. Next, dilution and concentration were repeated with n-butanol, to obtain 60 g of a concentrated dispersion containing 30 g of cuprous oxide fine particles, 6.0 g of Disperbyk-145 and 24 g of n-butanol.

Example 2

To 0.20 g of the concentrated dispersion obtained in Example 1 there were added 0.78 g of n-butanol, 0.010 g of 1,2-propylene glycol and 0.010 g of SURFLON S-611 (Seimi Chemical Co., Ltd.), and a homogenizer was used for dispersion to obtain a cuprous oxide dispersion. The mean secondary particle size was 30 nm. The dispersion was coated onto a PEN substrate (product of Teijin-DuPont Corp.) in a source electrode and drain electrode pattern by reverse printing, and a microwave plasma furnace was used for hot sintering at 0.8 kV for 300 seconds, to obtain a source electrode and drain electrode as an electroconductive film laminate. The obtained pattern is shown in FIG. 1. The area of the electroconductive film laminate was 900 cm. A p-BTTT-C16 organic semiconductor (Merck) was printed by an ink-let method at the channel section between the source electrode and the drain electrode, to form a semiconductor layer. Next, CYTOP (product of Asahi Glass Co., Ltd.) was spin coated so as to cover the organic semiconductor, source electrode and drain electrode, forming, an insulating film. The cuprous oxide dispersion was coated onto the insulating film by reverse printing into a gate electrode pattern, and a microwave plasma furnace was used for hot sintering at 0.8 kW for 300 seconds to form a gate electrode, in order to obtain a transistor with a copper electrode. The film thickness of the electrode section was 0.10 μm, the minimum line width was 5.0 μm, the minimum space width was 5.0 μm and the volume resistivity was 12×10$^{-6}$ Ω·cm. The mobility of the semiconductor was 2.0×10$^{-2}$ cm$^2$/(V·s). The results for dispersion and printing are shown in Table 1 below.

Example 3

To 0.80 g of the concentrated dispersion obtained in Example 1 there were added 0.10 g of n-butanol, 0.080 g of 1,2-propylene glycol and 0.020 g of SURFLON S-611, and a homogenizer was used for dispersion to obtain a cuprous oxide dispersion. The mean secondary particle size was 50 nm.

The dispersion was used to obtain a transistor with a copper electrode, by the same method as in Example 2. The film thickness of the electrode section was 0.40 μm, the minimum line width was 5.0 μm and the minimum space width was 5.0 μm. The volume resistivity of the electrode section was 14×10$^{-6}$ Ωcm. The mobility of the semiconductor was 1.0×10$^{-2}$ cm$^2$/(V·s). The results for dispersion and printing are shown in Table 1 below.

Example 4

To 0.020 g of the concentrated dispersion obtained in Example 1 there were added 0.97 g of n-butanol, 2.0 mg of 1,2-propylene glycol and 6.0 mg of SURFLON S-611, and a homogenizer was used for dispersion to obtain a cuprous oxide dispersion. The mean secondary particle size was 20 nm.

The dispersion was used to obtain a transistor with a copper electrode, by the same method as in Example 2. The film thickness of the electrode section was 0.030 μm, the minimum line width was 5.0 μm, the minimum space width was 5.0 μm and the volume resistivity was 14×10$^{-6}$ Ωcm. The mobility of the semiconductor was 1.0×10$^{-2}$ cm$^2$/(V·s). The results for dispersion and printing are shown in Table 1 below.

Example 5

To 0.20 g of the concentrated dispersion obtained in Example 1 there were added 0.060 g of Disperbyk-145 (BYK-Chemie GmbH), 0.72 g of n-butanol, 0.010 g of 1,2-propylene glycol and 0.010 g of SURFLON S-611 (Seimi Chemical Co., Ltd.), and a homogenizer was used for dispersion to obtain a cuprous oxide dispersion. The mean secondary particle size was 40 nm.

The dispersion was used to obtain a transistor with a copper electrode, by the same method as in Example 2. The film thickness of the electrode section was 0.10 μm, the minimum line width was 5.0 μm, the minimum space width was 5.0 μm and the volume resistivity was 22×10$^{-6}$ Ω·cm. The mobility of the semiconductor was 6.0×10$^{-3}$ cm$^2$/(V·s). The results for dispersion and printing are shown in Table 1 below.

Example 6

To 0.20 g of the concentrated dispersion obtained in Example 1 there were added 0.13 g of Disperbyk-145 (BYE-Chemie GmbH), 0.65 g of n-butanol, 0.010 g of 1,2-propylene glycol and 0.010 g of SURFLON S-611 (Seimi Chemical Co., Ltd.), and a homogenizer was used for dispersion to obtain a cuprous oxide dispersion. The mean secondary particle size was 50 nm.

The dispersion Was used to obtain a transistor with a copper electrode, by the same method as in Example 2. The film thickness of the electrode section was 0.10 μm, the minimum line width was 5.0 μm, the minimum space width was 5.0 μm and the volume resistivity was 500×10$^{-6}$ Ω·cm. The mobility of the semiconductor was 2.0×10$^{-3}$ cm$^2$/(V·s). The results for dispersion and printing are shown in Table 1 below.

Example 7

To 0.30 g of cupric oxide fine particles by CIK NanoTek Corp. there were added 0.060 g of Disperbyk-145 (BYK-Chemie GmbH), 0.61 g of n-butanol, 0.020 g of 1,2-propylene glycol and 0.010 g of SURFLON S-611 (Seimi Chemical Co., Ltd.), and a homogenizer was used for dispersion to obtain a cuprous oxide dispersion. The mean secondary particle size was 200 nm.

The dispersion was used to obtain a transistor with a copper electrode, by the same method as in Example 2. The film thickness of the electrode section was 0.3 μm. The minimum line width was 5.0 μm, the minimum space width was 5.0 μm and the volume resistivity was 32×10$^{-6}$ Ωcm. The mobility of the semiconductor was 4.0×10$^{-3}$ cm$^2$/(V·s). The results for dispersion and printing are shown in Table 1 below.

Example 8

To 0.50 g of cupric oxide fine particles by CIK NanoTek Corp. there were added 0.10 g of Disperbyk-145 (BYK-Chemie GmbH), 0.33 g of n-butanol, 0.070 g of 1,2-propylene glycol and 1.0 mg of SURFLON S-611 (Seimi Chemical Co., Ltd.), and a homogenizer was used for dispersion to obtain a cuprous oxide dispersion. The mean secondary particle size was 30 nm.

The dispersion was used to obtain a transistor with a copper electrode, by the same method as in Example 2. The film thickness of the electrode section was 0.50 μm, the minimum line width was 5.0 μm, the minimum space width was 5.0 μm and the volume resistivity was 44×10$^{-6}$ Ωcm. The mobility of the semiconductor was 2.0×10$^{-3}$ cm$^2$/(V·s). The results for dispersion and printing are shown in Table 1 below.

Comparative Example 1

By the same procedure as Example 1, 60 g of a concentrated dispersion was obtained containing 30 g of cuprous oxide fine particles and 30 g of n-butanol, without addition of Disperbyk-145 (BYK-Chemie GmbH). To 0.40 g of the concentrated dispersion there were added 0.53 g of n-butanol, 0.060 g of 1,2-propylene glycol and 0.010 g of SURFLON S-611 (Seimi Chemical Co., Ltd.), and was attempted to form a dispersion using a homogenizer, but aggregation occurred in air because no Disperbyk-145 dispersing agent (BYK-Chemie GmbH) was present. The mean secondary particle size was 900 nm, and it could not be used for reverse printing. Since it was not possible to accomplish printing of a source electrode and drain electrode on the substrate with this dispersion, it was not possible to measure the electrode volume resistivity.

Comparative Example 2

To 0.60 g of the concentrated dispersion obtained in Example 1 there were added 0.32 g of n-butanol and 0.080 g of 1,2-propylene glycol, and a homogenizer was used for dispersion to obtain a cuprous oxide dispersion. The mean secondary particle size was 40 nm.

Figure 2:
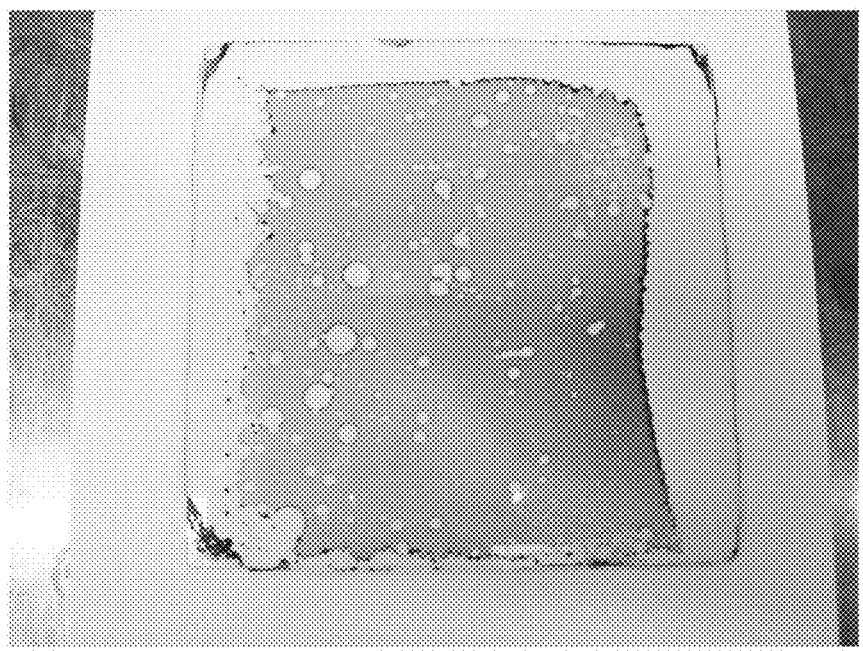
FIG. 2 is a photograph in lieu of a diagram, showing an example wherein a dispersion coating film could not be formed smoothly on a blanket.

It was attempted to coat the dispersion in a pattern onto a PEN substrate by reverse printing, but since the surface energy modifier SURFLON S-611 (Seimi Chemical Co., Ltd.) was not present, it was not possible to form a smooth dispersion coating film on the blanket. An example wherein a dispersion coating film could not be formed smoothly on a blanket is shown in FIG. 2. Since it was not possible to accomplish printing of a source electrode and drain electrode on the substrate with this dispersion, it was not possible to measure the electrode volume resistivity.

Comparative Example 3

To 0.20 g of the concentrated dispersion obtained in Example 1 there were added 0.79 g of n-butanol and 0.010 g of SURFLON S-611 (Seimi Chemical Co., Ltd.), and a homogenizer was used for dispersion to obtain a cuprous oxide dispersion. The mean secondary particle size was 30 nm.

It was attempted to coat the dispersion onto a PEN substrate in a pattern by reverse printing, but since 1,2-propylene glycol (Wako Pure Chemical Industries, Ltd.), which is a polyhydric alcohol having 10 or less carbon atoms, was not present, printing defects occurred and the desired conductive pattern could not be obtained. Since it was not possible to accomplish printing of a source electrode and drain electrode on the substrate with this dispersion, it was not possible to measure the electrode volume resistivity.

Comparative Example 4

To 0.40 g of the concentrated dispersion obtained in Example 1 there were added 0.44 g of n-butanol, 0.15 g of 1,2-propylene glycol and 0.010 g of SURFLON S-611 (Seimi Chemical Co., Ltd.), and a homogenizer was used for dispersion to obtain a cuprous oxide dispersion. The mean secondary particle size was 30 nm.

It was attempted to coat the dispersion onto a PEN substrate in a pattern by reverse printing, but since the content of the polyhydric alcohol having 10 or less carbon atoms exceeded 10.0 mass % of the dispersion, printing defects occurred and the desired conductive pattern could not be obtained. Since it was not possible to accomplish printing of a source electrode and drain electrode on the substrate with this dispersion, it was not possible to measure the electrode volume resistivity.

Comparative Example 5

By the same procedure as Example 1, 60 g of a concentrated dispersion was obtained with addition of water instead of n-butanol, containing 30 g of cuprous oxide fine particles, 6.0 g of Disperbyk-145 (BYK-Chemie GmbH) and 24 g of water. To 0.40 g of the concentrated dispersion there were added 0.53 g of water, 0.060 g of 1,2-propylene glycol and 0.010 g of SURFLON S-611 (Seimi Chemical Co., Ltd.), and it was attempted to form a dispersion using a homogenizer, but aggregation occurred in air because no monoalcohol having 10 or less carbon atoms was present. The mean secondary particle size was 600 nm, and it could not be used for reverse printing. Since it was not possible to accomplish printing of a source electrode and drain electrode on the substrate with this dispersion, it was not possible to measure the electrode volume resistivity.

Comparative Example 6

To 2.0 mg of the concentrated dispersion obtained in Example 1 there were added 0.99 g of n-butanol, 1.0 mg of 1,2-propylene glycol and 4.0 mg of SURFLON S-611 (Seimi Chemical Co., Ltd.), and a homogenizer was used for dispersion to obtain a cuprous oxide dispersion. The mean secondary particle size was 20 nm.

It was attempted to coat the dispersion onto a PEN substrate in a pattern by reverse printing, but since the cuprous oxide fine particle content was low, printing defects occurred and the desired conductive pattern could not be obtained. Since it was not possible to accomplish printing of a source electrode and drain electrode on the substrate with this dispersion, it was not possible to measure the electrode volume resistivity.

Comparative Example 7

To 0.70 g of cupric oxide fine particles by CIK NanoTek Corp. there were added 0.14 g of Disperbyk-145 (BYK-Chemie GmbH), 0.15 g of n-butanol, 5.0 mg of 1,2-propylene glycol and 5.0 mg of SURFLON S-611 (Seimi Chemical Co., Ltd.), and it was attempted to form a dispersion using a homogenizer, but because the cupric oxide content was high, the viscosity was high and a paste-like form resulted. The mean secondary particle size could not be measured, and it could not be used for printing. Since it was not possible to accomplish printing of a source electrode and drain electrode on the substrate with this dispersion, it was not possible to measure the electrode volume resistivity.

Comparative Example 8

To 0.54 g of the concentrated dispersion obtained in Example 1 there were added 0.076 g of Disperbyk-145 (BYK-Chemie GmbH), 0.32 g of n-butanol, 0.027 g of 1,2-propylene glycol and 0.027 g of SURFLON S-611 (Seimi Chemical Co., Ltd.), and a homogenizer was used for dispersion to obtain a cuprous oxide dispersion. The mean secondary particle size was 30 nm.

It was attempted to coat the dispersion onto a PEN substrate in a pattern by reverse printing, but since the surface energy modifier content exceeded 2.0 mass % of the dispersion, printing defects occurred and the desired conductive pattern could not be obtained. Since it was not possible to accomplish printing of a source electrode and drain electrode on the substrate with this dispersion, it was not possible to measure the electrode volume resistivity.

TABLE 1

|  | Example 2 | Example 3 | Example 4 | Example 5 | Example 6 | Example 7 | Example 8 |
| --- | --- | --- | --- | --- | --- | --- | --- |
| Copper oxide | 10 | 40 | 1.0 | 10 | 10 | 30 | 50 |
| BuOH H$_2$O | 86 | 42 | 98 | 80 | 73 | 61 | 33 |

TABLE 1-continued

| | | | | | | | |
|---|---|---|---|---|---|---|---|
| BYK | 2.0 | 8.0 | 0.20 | 8.0 | 15 | 6.0 | 10 |
| PG | 1.0 | 8.0 | 0.20 | 1.0 | 1.0 | 2.0 | 7.0 |
| S611 | 1.0 | 2.0 | 0.60 | 1.0 | 1.0 | 1.0 | 0.10 |
| Particle size | 30 | 50 | 20 | 40 | 50 | 200 | 300 |
| Printing | A | A | A | A | A | A | A |
| Film thickness | 0.1 | 0.4 | 0.03 | 0.1 | 0.1 | 0.3 | 0.5 |
| Resistivity | 12 | 14 | 14 | 22 | 500 | 32 | 44 |
| Mobility | 2.0 | 1.0 | 1.0 | 0.60 | 0.20 | 0.40 | 0.20 |

| | Comp. Example 1 | Comp. Example 2 | Comp. Example 3 | Comp. Example 4 | Comp. Example 5 | Comp. Example 6 | Comp. Example 7 | Comp. Example 8 |
|---|---|---|---|---|---|---|---|---|
| Copper oxide | 20 | 30 | 10 | 20 | 20 | 0.10 | 70 | 27 |
| BuOH | 73 | 56 | 87 | 60 | | 99 | 15 | 54 |
| H$_2$O | | | | | 69 | | | |
| BYK | | 6.0 | 2.0 | 4.0 | 4.0 | 0.020 | 14 | 13 |
| PG | 6.0 | 8.0 | | 15 | 6.0 | 0.10 | 0.50 | 2.7 |
| S611 | 1.0 | | 1.0 | 1.0 | 1.0 | 0.40 | 0.50 | 2.7 |
| Particle size | 900 | 40 | 30 | 30 | 600 | 20 | — | 30 |
| Printing | — | B | B | B | — | B | — | B |
| Film thickness | — | — | — | — | — | — | — | — |
| Resistivity | — | — | — | — | — | — | — | — |
| Mobility | — | — | — | — | — | — | — | — |

The meanings of the symbols in the table are as follows:
Copper oxide: Content of cuprous oxide or cupric oxide, units: wt %
BuOH: Content of n-butanol, units: wt %
H$_2$O: Content of water, units: wt %
BYK: Content of Disperbyk-145, units: wt %
PG: Content of 1,2-propylene glycol, units: wt %
S611: Content of SURFLON S-611, units: wt %
Particle size: Mean secondary particle size, units: nm
Printing: A = Satisfactory printing, B = Unsatisfactory printing
Film thickness: Units: μm
Resistivity: Volume resistivity, units: $10^{-6}$ Ω · cm
Mobility: Mobility of semiconductor, units: $10^{-2}$ cm$^2$/(V · s)

INDUSTRIAL APPLICABILITY

The transistor of the invention has an intricately patterned electrode formed by a step of printing a copper or copper oxide dispersion. Consequently, the transistor of the invention can be suitably used for purposes such as high-performance electronic devices.

What is claimed is:

1. A dispersion of copper and/or copper oxide, wherein the dispersion contains copper and/or copper oxide microparticles in an amount of between 0.50 mass % and 60 mass %, inclusive relative to the total mass of the dispersion, as well as the following (1) to (4):
   (1) a fluorine-containing surfactant that modifies a surface free energy of the dispersion, in an amount of between 0.10 mass % and 2.0 mass %, inclusive relative to the total mass of the dispersion,
   (2) an organic dispersing agent having a phosphate group and a number average molecular weight (Mn) of 300 to 30000, in an amount of between 0.10 mass % and 20 mass %, inclusive relative to the total mass of the dispersion,
   (3) a dispersing medium having a vapor pressure of 0.010 Pa or higher and lower than 20 Pa at 20° C., in an amount of between 0.050 mass % and 10 mass %, inclusive relative to the total mass of the dispersion, and
   (4) a dispersing medium having a vapor pressure of between 20 Pa and 150 hPa, inclusive relative to the total mass of the dispersion, at 20° C.,
   wherein the dispersion has a surface free energy of no greater than 40 mN/m at 25° C.

2. The dispersion according to claim 1, wherein the (3) dispersing medium having a vapor pressure of 0.010 Pa or higher and lower than 20 Pa at 20° C. is a polyhydric alcohol having 10 or less carbon atoms.

3. The dispersion according to claim 1, wherein the (4) dispersing medium having a vapor pressure of between 20 Pa and 150 hPa, inclusive, at 20° C. is a monoalcohol having 10 or less carbon atoms.

4. The dispersion according to claim 1, wherein the copper and/or copper oxide is cuprous oxide or cupric oxide.

5. The dispersion according to claim 4, wherein the copper and/or copper oxide is cuprous oxide.

6. A method of producing a copper electrode or an electroconductive film comprising printing the dispersion of copper and/or copper oxide according to claim 1 on a substrate.

7. A method of producing a copper electrode or an electroconductive film comprising:
   printing the dispersion of copper and/or copper oxide according to claim 1 on a substrate; and
   reducing the dispersion to provide electroconductivity.

8. A dispersion of copper and/or copper oxide, containing copper and/or copper oxide microparticles in an amount of between 0.50 mass % and 60.0 mass %, inclusive relative to the total mass of the dispersion, and the following (1) to (4):
- (1) a fluorine-containing surfactant that modifies a surface free energy of the dispersion in an amount of between 0.10 mass % and 2.0 mass %, inclusive relative to the total mass of the dispersion,
- (2) an organic dispersing agent having a phosphate group and a number average molecular weight (Mn) of 300 to 30000, in an amount of between 0.10 mass % and 20 mass %, inclusive relative to the total mass of the dispersion,
- (3) a polyhydric alcohol having 10 or less carbon atoms in an amount of between 0.050 mass % and 10 mass %, inclusive relative to the total mass of the dispersion, and
- (4) a monoalcohol having 10 or less carbon atoms, wherein the dispersion has a surface free energy of no greater than 40 mN/m at 25° C.

* * * * *